(12) United States Patent
Hiroki et al.

(10) Patent No.: US 7,857,569 B2
(45) Date of Patent: Dec. 28, 2010

(54) SEMICONDUCTOR PROCESSING SYSTEM (75) Inventors: Tsutomu Hiroki, Nirasaki (JP); Hiroaki Saeki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 562 days.

(21) Appl. No.: 11/774,335

(22) Filed: Jul. 6, 2007

(65) Prior Publication Data
US 2008/0187416 A1 Aug. 7, 2008

Related U.S. Application Data (62) Division of application No. 10/503,947, filed as application No. PCT/JP03/00845 on Jan. 29, 2003, now abandoned.

(30) Foreign Application Priority Data
Feb. 25, 2002 (JP) ............................. 2002-47509

(51) Int. Cl.
*H01L 21/677* (2006.01)
(52) U.S. Cl. ..................... 414/217; 414/939
(58) Field of Classification Search .............. 414/217.1, 414/223.01, 939, 217
See application file for complete search history.

(56) References Cited

U.S. PATENT DOCUMENTS

| 5,677,824 | A | * | 10/1997 | Harashima et al. .......... 361/234 |
| 5,823,736 | A | | 10/1998 | Matsumura |
| 5,899,653 | A | | 5/1999 | Brodine |
| 5,989,346 | A | | 11/1999 | Hiroki |
| 6,109,677 | A | | 8/2000 | Anthony |
| 6,140,256 | A | | 10/2000 | Ushikawa |
| 6,171,402 | B1 | * | 1/2001 | Strodtbeck et al. .......... 118/712 |
| 6,193,807 | B1 | | 2/2001 | Tateyama et al. |

(Continued)

FOREIGN PATENT DOCUMENTS

EP 516 136 12/1992

(Continued)

OTHER PUBLICATIONS

Japanese Office Action issued Aug. 3, 2010, in Japanese Application No. 2008-199198 (with English-language Translation), 7 pages.

*Primary Examiner*—Saúl J Rodríguez
*Assistant Examiner*—Joshua I Rudawitz
(74) *Attorney, Agent, or Firm*—Oblon, Spivak, McClelland, Maier & Neustadt, L.L.P.

(57) ABSTRACT

A supporting mechanism (12A) is used for transfer-ring a target substrate (W) in cooperation with a transfer arm (32), in a semiconductor processing system. The supporting mechanism includes first and second holding portions (38A to 38C, 40A to 40C) each configured to be moved up and down and transfer a substrate to and from the transfer arm. The first and second holding portions are configured to be moved relative to each other in a vertical direction without spatially interfering with each other, and support substrates at substantially the same horizontal coordinate position. The supporting mechanism further includes first and second drives (46, 48) configured to move the first and second holding portions up and down, and a controller (68) configured to control the first and second drives. The controller is arranged to control the first and second drives to alternatively support a substrate by the first and second holding portions.

17 Claims, 9 Drawing Sheets

U.S. PATENT DOCUMENTS

| | | | |
|---|---|---|---|
| 6,231,716 B1 * | 5/2001 | White et al. | 156/345.54 |
| 6,247,579 B1 | 6/2001 | Fujiyama et al. | |
| 6,331,095 B1 | 12/2001 | Hiroki | |
| 6,403,924 B1 | 6/2002 | Hayashi | |
| 6,485,248 B1 | 11/2002 | Taylor, Jr. | |
| 6,607,380 B1 | 8/2003 | Nakazato | |
| 6,676,761 B2 | 1/2004 | Shang et al. | |
| 6,709,521 B1 * | 3/2004 | Hiroki | 118/719 |
| 6,767,170 B2 * | 7/2004 | Kostler et al. | 414/217 |
| 6,837,672 B1 | 1/2005 | Tateyama et al. | |
| 6,913,243 B1 * | 7/2005 | Tomasch | 251/167 |
| 6,962,477 B2 | 11/2005 | Tateyama et al. | |
| 7,301,623 B1 * | 11/2007 | Madsen et al. | 356/244 |

FOREIGN PATENT DOCUMENTS

| | | | |
|---|---|---|---|
| JP | 04-069917 | | 3/1992 |
| JP | 05243366 A | * | 9/1993 |
| JP | 6-87507 | | 3/1994 |
| JP | 8-64655 | | 3/1996 |
| JP | 8-203986 | | 8/1996 |
| JP | 9-223727 | | 8/1997 |
| JP | 10-247674 | | 9/1998 |
| JP | 2000-208589 | | 7/2000 |
| JP | 2000-299367 | | 10/2000 |
| JP | 2001-176947 | | 6/2001 |
| JP | 2001-308084 | | 11/2001 |

* cited by examiner

FIG. 14

SEMICONDUCTOR PROCESSING SYSTEM

CROSS-REFERENCE TO RELATED APPLICATIONS

This application is a divisional of U.S. patent application Ser. No. 10/503,947, filed Aug. 18, 2004, which is a National Stage of PCT/JP03/00845, filed Jan. 29, 2003, and in turn claims priority to Japan Patent Application No. 2002-047509, filed Feb. 25, 2002, the entire contents of each of which are incorporated herein by reference.

TECHNICAL FIELD

The present invention relates to a supporting mechanism used for transferring a target substrate, such as a semiconductor wafer, in cooperation with a transfer arm, in a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

BACKGROUND ART

In the process of manufacturing semiconductor integrated circuits, a wafer is subjected to various processes, such as film-formation, etching, oxidation, and diffusion. Owing to the demands of increased miniaturization and integration of semiconductor integrated circuits, the throughput and yield involving these processes need to be increased. In light of this, there is a semiconductor processing system of the so-called cluster tool type, which has a plurality of process chambers for performing the same process, or a plurality of process chambers for performing different processes, connected to a common transfer chamber. With a system of this type, various steps can be performed in series, without exposing a wafer to air. For example, Jpn. Pat. Appln. KOKAI Publication Nos. 2000-208589 and 2000-299367 disclose a semiconductor processing system of the cluster tool type.

In a semiconductor processing system of the cluster tool type, there are a plurality of transfer arms for transferring a semiconductor wafer. Each transfer arm is arranged to extend, contract, and rotate or move horizontally. The transfer arms sequentially transfer a wafer among them from a wafer cassette to processing apparatuses or vice versa.

In general, transfer of a wafer between transfer arms is not directly performed therebetween, but via a supporting mechanism disposed therebetween, which can move the wafer up and down, or a buffer table having such a supporting mechanism. The wafer is transferred onto the supporting mechanism or buffer table by one of the transfer arms, and is then transferred from the supporting mechanism or buffer table by the other of the transfer arms.

Depending on the processing manner of a wafer, the wafer is temporarily kept waiting in a transfer chamber in the middle of transfer, and another wafer is transferred by priority. In this case, the transfer chamber may be provided with a supporting mechanism or buffer table as that described above. For example, Jpn. Pat. Appln. KOKAI Publication Nos. 4-69917, 9-223727, and 2001-176947 disclose a supporting mechanism or buffer table of this kind.

In handling semiconductor wafers for a film-formation process, for example, there is a case where processed wafers are accompanied by thin films sticking to the bottom, as well as the top as a matter of course. In this case, if lifter pins or the like come into direct contact with the bottom of wafers to handle them, unprocessed wafers are contaminated with film particles transferred from the lifter pins.

Furthermore, the supporting mechanisms disclosed in the publications mentioned above include two lifters for moving a wafer up and down, which are used at the same time to transfer a wafer. Accordingly, it is difficult to use the supporting mechanisms flexibly in light of the situation.

DISCLOSURE OF INVENTION

An object of the present invention is to provide a substrate supporting mechanism for a semiconductor processing system, which includes two holding portions alternatively usable in light of the situation, and has a compact structure.

According to an aspect of the present invention, there is provided a supporting mechanism used for transferring a target substrate in cooperation with a transfer arm, in a semiconductor processing system, the supporting mechanism comprising:

first and second holding portions each configured to be moved up and down and transfer a substrate to and from the transfer arm, the first and second holding portions being configured to be moved relative to each other in a vertical direction without spatially interfering with each other, and support substrates at substantially the same horizontal coordinate position;

first and second drives configured to move the first and second holding portions up and down; and a controller configured to control the first and second drives, the controller being arranged to control the first and second drives to alternatively support a substrate by the first and second holding portions.

BEST MODE FOR CARRYING OUT THE INVENTION

Embodiments of the present invention will be described hereinafter with reference to the accompanying drawings. In the following description, the constituent elements having substantially the same function and arrangement are denoted by the same reference numerals, and a repetitive description will be made only when necessary.

First Embodiment

Figure 1:
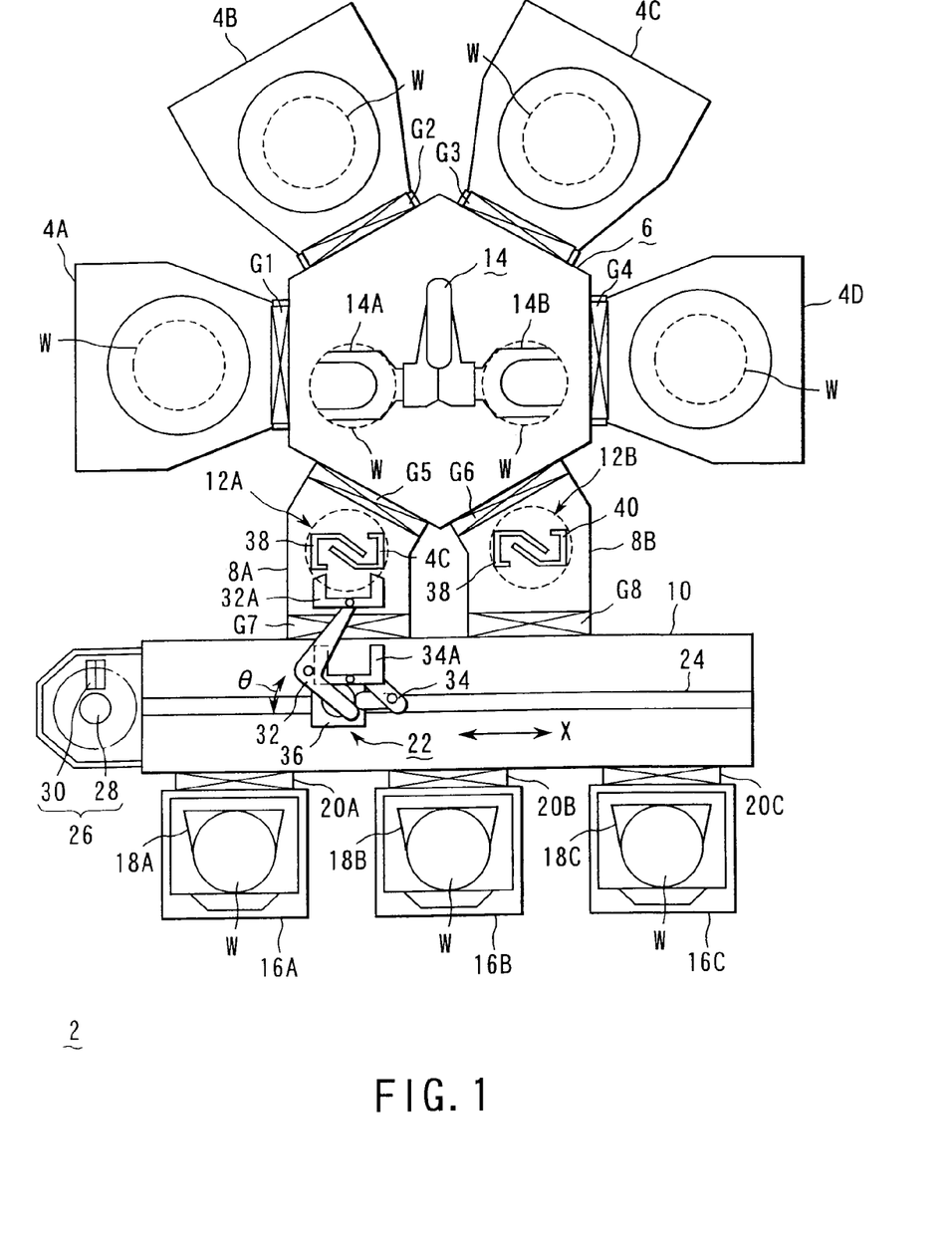
FIG. 1 is a schematic plan view showing a semiconductor processing system including a substrate supporting mechanism according to a first embodiment of the present invention.

FIG. 1 is a schematic plan view showing a semiconductor processing system including a substrate supporting mechanism according to a first embodiment of the present invention.

As shown in FIG. 1, the processing system 2 includes a plurality of, e.g., four processing apparatuses 4A, 4B, 4C, and 4D, an almost hexagonal common transfer chamber 6, first and second intermediate chambers (load-lock chambers) 8A and 8B, and a thin and long entrance transfer chamber 10. The intermediate chambers 8A and 8B are respectively provided with substrate supporting mechanisms 12A and 12B. Each of the common transfer chamber 6 and first and second intermediate chambers 8A and 8B are formed of an airtight chamber, which can be vacuum exhausted.

More specifically, the processing apparatuses 4A to 4D are respectively connected to four sides of the almost hexagonal common transfer chamber 6, and the first and second intermediate chambers 8A and 8B are respectively connected to the other two sides thereof. In other words, the processing system 2 has a structure of the cluster tool type in which the processing apparatuses and intermediate chambers are connected to and around the common transfer chamber 6. The entrance transfer chamber 10 is connected to the first and second intermediate chambers 8A and 8B in common. The processing apparatuses 4A to 4D and first and second intermediate chambers 8A and 8B are connected to the common transfer chamber 6 respectively through gate valves G1 to G4, and G5 and G6, which are airtightly opened and closed. The first and second intermediate chambers 8A and 8B are connected to the entrance transfer chamber 10 respectively through gate valves G7 and G8, which are airtightly opened and closed.

The four processing apparatuses 4A to 4D are designed to perform the same process or different processes on a target substrate or semiconductor wafer in a vacuum atmosphere. The common transfer chamber 6 is provided with first transfer means 14 disposed therein at a position to access the two intermediate chambers 8A and 8B and four processing apparatuses 4A to 4D. The first transfer means 14 is formed of an articulated arm that can extend, contract, and rotate. The first transfer means 14 has two picks 14A and 14B, which can independently extend and contract in opposite directions, so that it can handle two wafers at a time. Alternatively, the first transfer means 14 may have only one pick.

The entrance transfer chamber 10 has a long thin box-type configuration in which an inactive gas, such as $N_2$ gas, or clean air is circulated. One or more cassette tables, e.g., three cassette tables 16A, 16B, and 16C in this example, are disposed on one side of this laterally long box. The cassette tables 16A, 16B, and 16C are configured to place cassettes 18A to 18C thereon, respectively.

Each of the cassettes 18A to 18C is structured to store, e.g., 25 wafers W at most, at regular intervals in the vertical direction. Each of the cassettes 18A to 18C has an airtight structure filled with, e.g., an $N_2$ gas atmosphere. Wafers are transferred into and from the entrance transfer chamber 10 through gate doors 20A, 20B, and 20C disposed correspondingly to the cassette tables 16A to 16C.

The entrance transfer chamber 10 is provided with second transfer means 22 disposed therein, for transferring wafers W in its longitudinal direction. The second transfer means 22 is supported on and slides along a guide rail 24 that extends in the longitudinal direction at the center of the entrance transfer chamber 10. The guide rail 24 has an actuating mechanism, such as a linear motor, built therein. The linear motor moves the second transfer means 22 on the guide rail 24 in an X-direction.

An alignment device or orientor 26 for performing alignment of a wafer is disposed at one end of the entrance transfer chamber 10. The orientor 26 includes a rotary table 28, which is rotated by a driving motor (not shown), along with a wafer W placed thereon. An optical sensor 30 is disposed beside the rotary table 28, for detecting the periphery of the wafer W. The optical sensor 30 is used to detect the direction and misalignment of the notch or orientation flat of the wafer W.

The second transfer means 22 has two transfer arms 32 and 34 formed of articulated arms and disposed on upper and lower sides. The transfer arms 32 and 34 respectively have fork-like picks 32A and 34A at their distal ends, on each of which a wafer W is directly held. Each of the transfer arms 32 and 34 can extend and contract in a radial direction R from the center. The transfer arms 32 and 34 can be controlled to extend and contract independently of each other. The transfer arms 32 and 34 can integratedly rotate in the angular direction θ relative to a base 36.

Next, an explanation will be given of the supporting mechanisms 12A and 12B respectively disposed in the intermediate chambers 8A and 8B. Since the two supporting mechanisms 12A and 12B have completely the same structure, only one of them, e.g., the supporting mechanism 12A will be exemplified.

Figure 2:
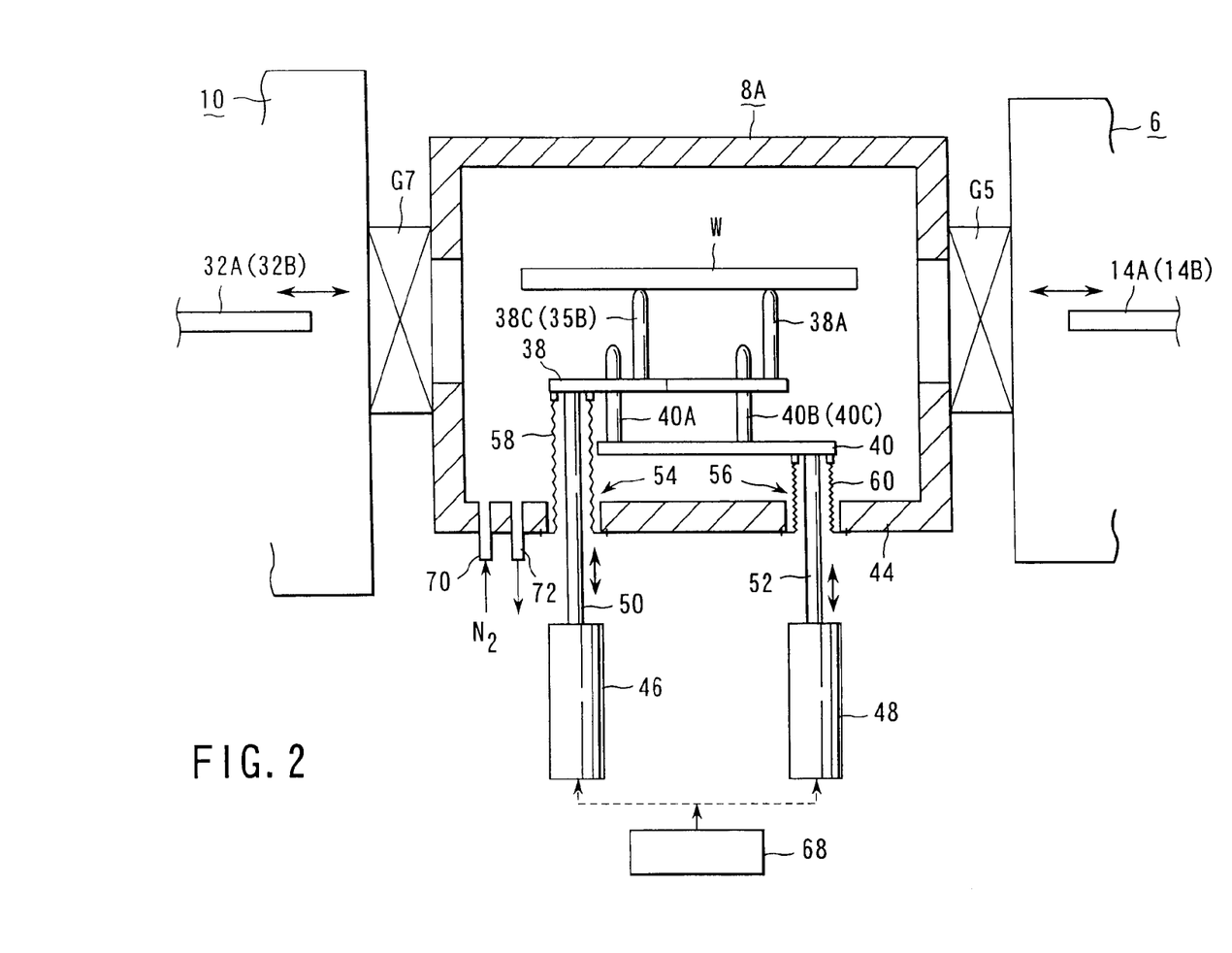
FIG. 2 is a sectional view showing an intermediate chamber having a load-lock function and provided with the supporting mechanism shown in FIG. 1.
Figure 3:
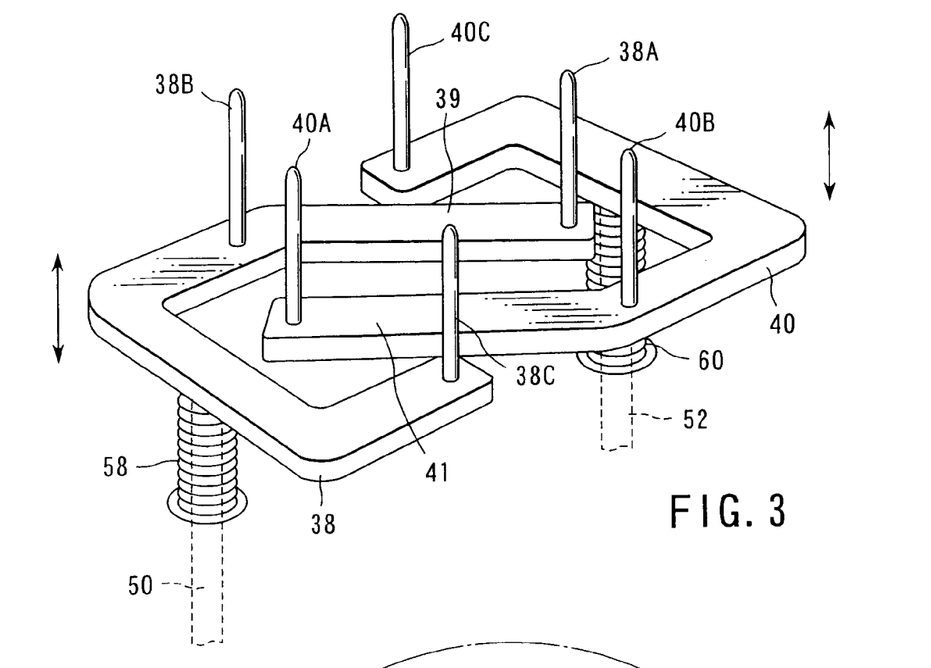
FIG. 3 is a perspective view of the supporting mechanism shown in FIG. 1.
Figure 4:
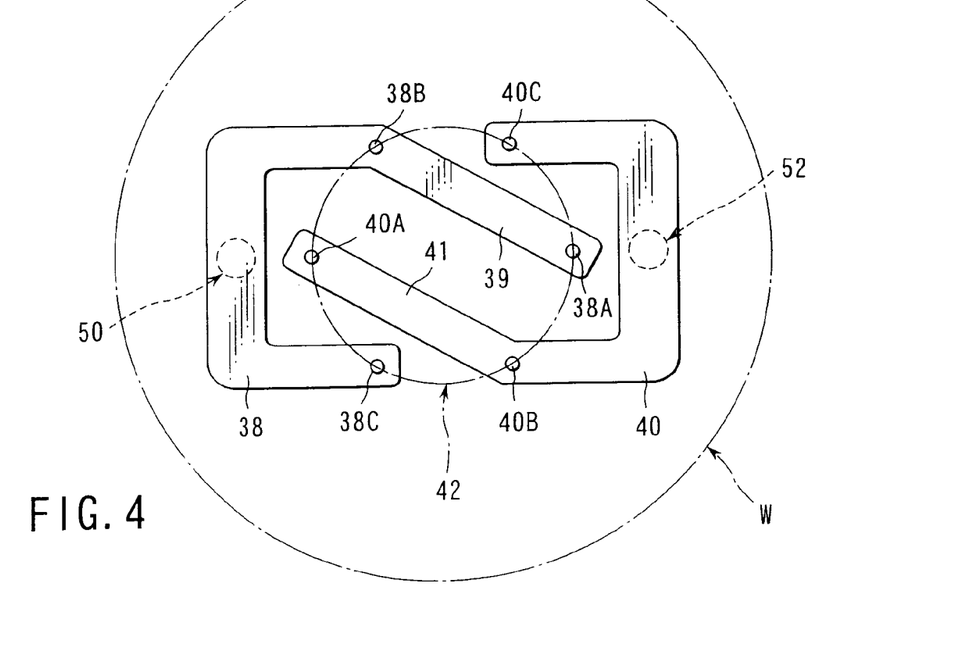
FIG. 4 is a plan view of the supporting mechanism shown in FIG. 1.

FIG. 2 is a sectional view showing an intermediate chamber having a load-lock function and provided with the supporting mechanism shown in FIG. 1. FIGS. 3 and 4 are a perspective view and a plan view, respectively, of the supporting mechanism shown in FIG. 1

As shown in FIGS. 2 to 4, the supporting mechanism 12A includes a plurality of, e.g., two in this example, base frames 38 and 40, each of which is formed of a thin plate bar bent to form a numeral "7" shape, and made of, e.g., aluminum or ceramic. The two base frames 38 and 40 are disposed not to overlap with each other in the plan view, so that they do not hit or interfere with each other when they are moved up and down. As shown in FIGS. 3 and 4, the base frames 38 and 40 have extension portions 39 and 41, which extend toward each other and mutually beyond their tips into cut spaces in the base frames.

Each of the base frames 38 and 40 is provided with a plurality of, e.g., three in this embodiment, lifter pins 38A to 38C or 40A to 40C standing upward therefrom. The lifter pins 38A to 38C and 40A to 40C are made of ceramic, such as $Al_2O_3$. Each group of lifter pins 38A to 38C and 40A to 40C supports a wafer W, while their top ends are in direct contact with the bottoms of the wafers.

As shown also in FIG. 4, each group of lifter pins 38A to 38C and 40A to 40C are disposed along one common circle 42 at regular intervals (intervals of about 120 degrees). The number of lifter pins disposed on one base frame 38 or 40 needs to be at least three. The two groups of the lifter pins 38A to 38C and 40A to 40C may be respectively disposed along different circles.

The two actuators 46 and 48 are disposed at the bottom plate 44 (see FIG. 2) of the intermediate chamber 8A, and used for the two base frames 38 and 40, respectively. The actuators 46 and 48 include reciprocation rods 50 and 52, which extend through holes 54 and 56 formed in the bottom plate 44, and connected or fixed at the top to the bottoms of the base frames 38 and 40, respectively. The actuators 46 and 48 can move up and down the base frames 38 and 40 independently of each other.

The actuators 46 and 48 are set to give the same stroke of the vertical movement to the lifter pins 38A to 38C and lifter pins 40A to 40C. Furthermore, the uppermost and lowermost positions of the top ends of the lifter pins 38A to 38C are essentially the same as the uppermost and lowermost positions of the top ends of the lifter pins 40A to 40C. In other words, the lifter pins 38A to 38C and lifter pins 40A to 40C share essentially the same position where a wafer W is transferred to and from the first transfer means 14 or second transfer means 22. However, even if the two members have different vertical strokes or different uppermost and lowermost positions, a wafer W can be transferred to and from the first and second transfer means 14 and 22, using vertical movement of the first and second transfer means 14 and 22.

Figure 5:
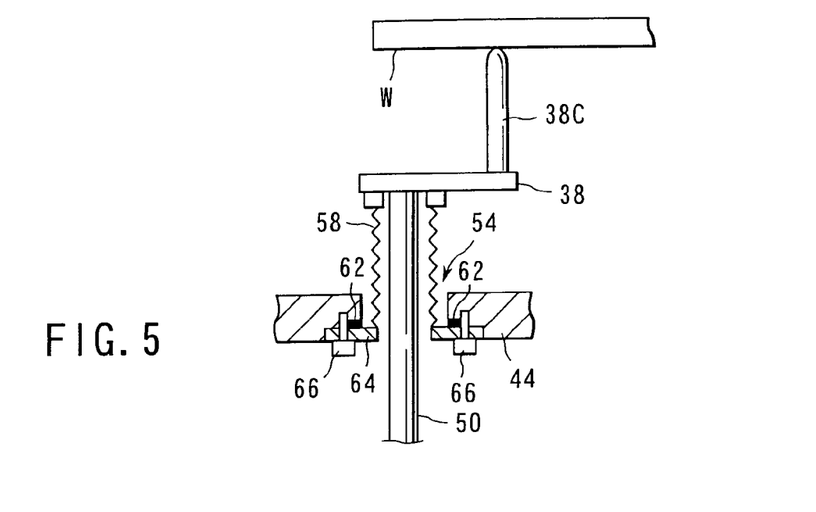
FIG. 5 is an enlarged partial view showing the supporting structure of a reciprocation rod used in the supporting mechanism shown in FIG. 1.

Those portions of the bottom plate 44, where the reciprocation rods 50 and 52 penetrate, are respectively provided with bellows 58 and 60 each formed of, e.g., a longitudinally flexible metal accordion hose. More specifically, as shown in FIG. 5, the reciprocation rods 50 and 52 are respectively inserted in the bellows 58 and 60. The upper ends of the bellows 58 and 60 are airtightly connected to the bottoms of the base frames 38 and 40, respectively. The lower ends of the bellows 58 and 60 are airtightly fixed to the bottom of the bottom plate 44 by screws 66 each through a seal member 62 and an attachment ring 64.

The bellows 58 and 60 thus arranged maintain the interior of the intermediate chamber 8A airtight, while allowing the reciprocation rods 50 and 52 to be moved up and down. A vertical movement controller 68 formed of, e.g., a microcomputer is used to control the operation of the actuators 46 and 48.

Each of the intermediate chambers 8A and 8B has a port 70 for feeding an inactive gas, such as N2 gas, and an exhaust port 72 connected to a vacuum exhaust section (not shown), wherein the ports are formed in, e.g., the bottom of the chamber. This arrangement is used to set the pressure inside the intermediate chambers 8A and 8B between a vacuum atmosphere and atmospheric pressure atmosphere, as needed.

Next, an explanation will be given of an outline of the flow of a wafer W, in relation to the semiconductor processing system shown in FIG. 1.

First, an unprocessed wafer W is picked up from one of the cassettes placed on the three cassette tables 16A to 16C, e.g., the cassette 18C placed on the cassette table 16C. At this time, one of the transfer arms of the second transfer means 22, e.g., the transfer arm 32, is operated to pick up and hold the wafer W from the cassette 18C by the pick 32A. Then, the second transfer means 22 is moved in the X-direction to transfer the wafer W to the orientor 26.

Then, an unprocessed wafer W, which has been aligned by the orientor 26, is taken out of the rotary table 28 to make the rotary table 28 free. For this purpose, the other transfer arm 34, which is unoccupied, is operated to pick up and hold, by the pick 34A, the wafer W from the rotary table 28.

Then, the transfer arm 32 is operated to place the unprocessed wafer held on the pick 32A onto the unoccupied rotary table 28. This wafer is subjected to alignment by the time when a next unprocessed wafer is transferred thereto. Then, the second transfer means 22 is moved in the X-direction to transfer the unprocessed wafer, which has been taken out of the rotary table 28 by the other transfer arm 34, to one of the two intermediate chambers 8A and 8B, e.g., the intermediate chamber 8A.

Then, the gate valve G7 is opened to open the intermediate chamber 8A, which has been adjusted in pressure. At this time, a processed wafer that has been subjected to a predetermined process, such as a film-formation process or etching process, is waiting on one of the groups of the lifter pins, e.g., lifter pins 40A to 40C in the intermediate chamber 8A.

Then, the unoccupied transfer arm 32 is operated to pick up and hold, by the pick 32A, the processed wafer W waiting on the lifter pins 40A to 40C. Then, the other transfer arm 34 is operated to place the unprocessed wafer held on the pick 34A onto the other group of lifter pins 38A to 38C. On the other hand, the processed wafer is returned back to the original cassette by the second transfer means 22.

After the unprocessed wafer W is placed on the lifter pins 38A to 38C, the gate valve G7 is closed to make the intermediate chamber 8A airtight. Then, the pressure in the intermediate chamber 8A is adjusted by vacuum exhaust. Then, the gate valve G5 is opened to cause the intermediate chamber 8A to communicate with the common transfer chamber 6, which has been set to have a vacuum atmosphere in advance. Then, the first transfer means 14 in the common transfer chamber 6 is operated to pick up the unprocessed wafer W. At this time, if a processed wafer is held on the first transfer means 14, the processed wafer is replaced with the unprocessed wafer, using the two picks 14A and 14B of the first transfer means 14.

Then, the unprocessed wafer W is sequentially subjected to the necessary processes in the processing apparatuses 4A to 4D, for example. After the necessary processes are completed, the processed wafer W is returned back to the original cassette, through a route reverse to that described above. At this time, the processed wafer W can be transferred through either one of the two intermediate chambers 8A and 8B. When the processed wafer W is held in the intermediate chambers 8A and 8B, the lifter pins 40A to 40C are used, which belong to a group other than the group used for holding the unprocessed wafer W. As a consequence, the unprocessed wafer W is prevented, as far as possible, from being contaminated by contaminants, such as thin films.

Next, a detailed explanation will be given as to how a wafer W is transferred in the intermediate chamber 8A. Wafer transfer in the other intermediate chamber 8B is performed in the same manner.

In this embodiment, as described above, unprocessed wafers W are handled by a group of lifter pins different from a group used for handling processed wafers W, to prevent contamination of the wafers W. For example, the three lifter pins 38A to 38C disposed on the base frame 38 are exclusively used for supporting unprocessed wafers W, while the three lifter pins 40A to 40C disposed on the other base frame 40 are exclusively used for supporting processed wafers W. The following explanation will take as an example a case where an unprocessed wafer W transferred in from the entrance transfer chamber 10, and a processed wafer W is replaced with the unprocessed wafer W.

First, the lifter pins 40A to 40C of the base frame 40 supporting the processed wafer W are placed at an upper position, and the unoccupied lifter pins 38A to 38C of the other base frame 38 are placed at a lower position. In this sate, the unoccupied pick 32A is moved in a horizontal direction into the intermediate chamber 8A, and inserted into a position below the processed wafer W (between the wafer W and base frame 40). Then, the lifter pins 40A to 40C are moved down to transfer the processed wafer W onto the pick 32A. Then, the pick 32A is moved backward to retreat from the intermediate chamber 8A.

Then, the other pick 34A holding the unprocessed wafer W is moved in a horizontal direction into the intermediate chamber 8A. Then, the other base frame 38 at the lower position is moved up, so that the lifter pins 38A to 38C receive the unprocessed wafer W from below. Then, the unoccupied pick 34A is moved backward to retreat from the intermediate chamber 8A. As a consequence, the processed wafer W is replaced with the unprocessed wafer W. Basically the same operation is performed when a wafer W is transferred between the common transfer chamber 6 and intermediate chamber 8A.

In the operation described above, the lifter pins 38A to 38C keep supporting the unprocessed wafer W until the wafer W is transferred onto the first transfer means 14, after receiving the wafer W from the second transfer means 22. During this time, the lifter pins 40A to 40C support no wafer W. On the other hand, the lifter pins 40A to 40C keep supporting the processed wafer W until the wafer W is transferred onto the second transfer means 22, after receiving the wafer W from the first transfer means 14. During this time, the lifter pins 38A to 38C support no wafer W. In summary, the lifter pins 38A to 38C and the lifter pins 40A to 40C alternatively support a wafer W. This matter is also common to the following embodiments. The two groups of the lifter pins 38A to 38C and lifter pins 40A to 40C can be arbitrarily set to be used either for unprocessed wafers W or for processed wafers W.

The first embodiment includes a plurality of, e.g., two, base frames 38 and 40, each having a plurality of, e.g., three, lifter pins 38A to 38C or 40A to 40C disposed thereon. One group of lifter pins 38A to 38C is exclusively used for transferring unprocessed wafers W, and the other group of lifter pins 40A to 40C is exclusively used for transferring processed wafers W. As a consequence, unprocessed wafers W are prevented from being contaminated by substances or particles derived from thin films.

Furthermore, even if one of the base frames or actuators malfunctions, the other base frame can keep operating to move up and down to transfer a wafer W, as described above. Accordingly, this improves the flexibility of usage.

The first embodiment includes the two base frames 38 and 40, but may have a third base frame or more, which are disposed not to interfere with the two base frames 38 and 40, and each provided with lifter pins, as described above.

The supporting mechanisms disclosed in the publication mentioned in "Background Art" include two lifters for moving a wafer up and down, and transfer a wafer, using the two lifters at the same time. Accordingly, it is difficult to use the supporting mechanisms flexibly in light of the situation. More specifically, for example, the supporting mechanism disclosed in Jpn. Pat. Appln. KOKAI Publication No. 9-223727 includes two sets of target substrate supporting means (support pins), which can be moved independently of each other. The two sets of supporting means support only one target substrate in cooperation with each other, or the two sets of supporting means simultaneously and respectively support an unprocessed target substrate and a processed target substrate.

On the other hand, the substrate supporting mechanism according to the first embodiment includes two (a plurality of) sets of target substrate supporting means (corresponding to the two base frames 38 and 40 in this embodiment), which are disposed not to interfere with each other, and support target substrates W at substantially the same horizontal coordinate position to transfer them to and from a transfer unit. The two (a plurality of) sets of target substrate supporting means alternatively support a target substrate (only one set of supporting means supports one target substrate at a time). In other words, when one set of supporting means supports a target substrate, the other set of supporting means supports no target substrate. Accordingly, the supporting mechanism according to the first embodiment has a structure completely different from that of the prior art described above. This matter is also common to the following embodiments.

Second Embodiment

Figure 6:
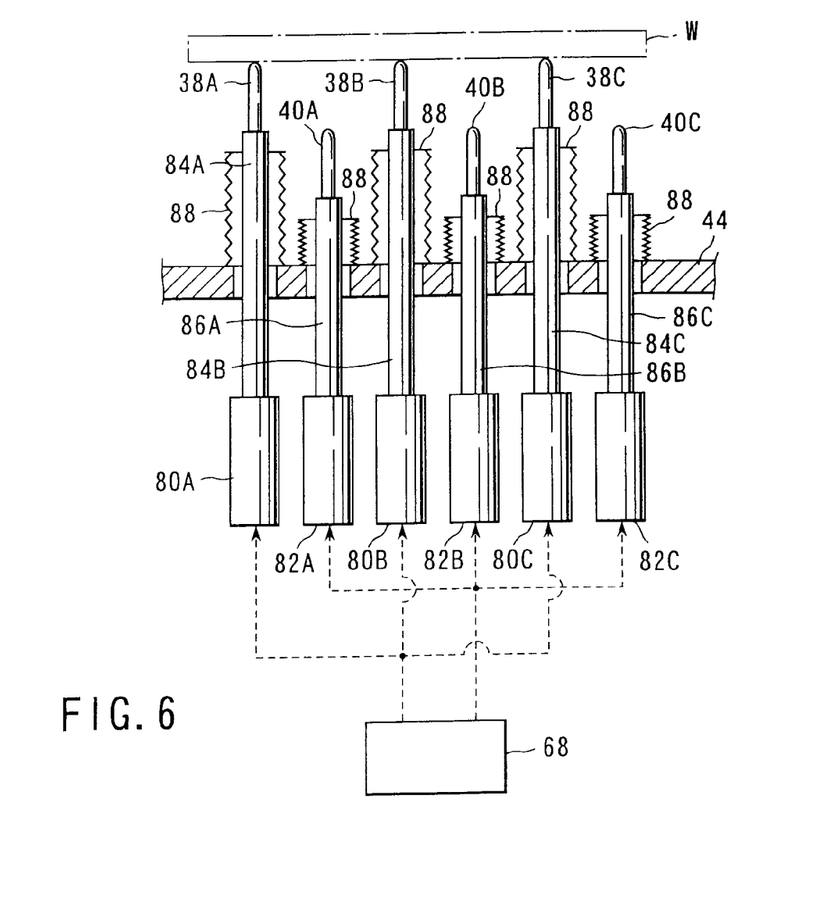
FIG. 6 is a view schematically showing the placement of actuators used in a supporting mechanism according to a second embodiment of the present invention.
Figure 7:
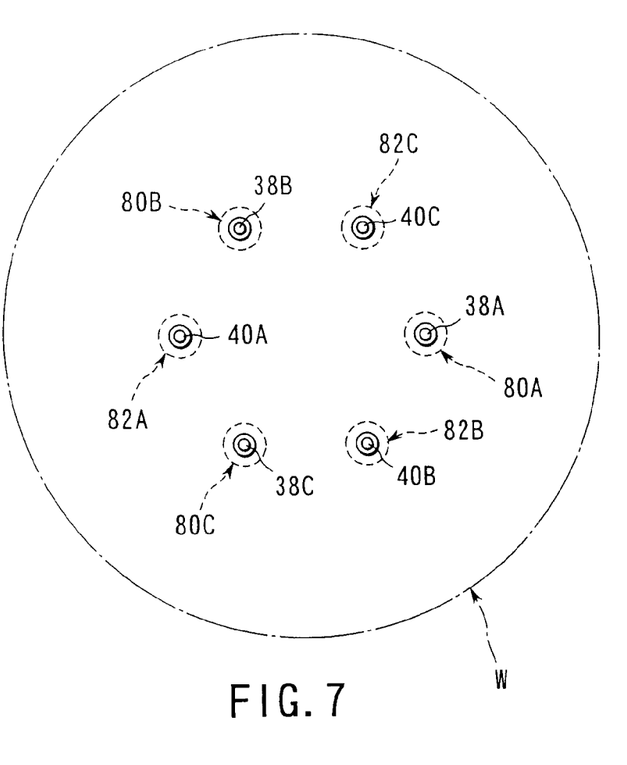
FIG. 7 is a plan view showing the placement of lifter pins used in the supporting mechanism shown in FIG. 6.

The first embodiment includes a plurality of, e.g., two, base frames each provided with a plurality of, e.g., three, lifter pins 38A to 38C or 40A to 40C. Instead, there may be lifter pins 38A to 38C and 40A to 40C respectively provided with actuators one by one. In such an aspect, FIG. 6 is a view schematically showing the placement of actuators used in a supporting mechanism according to a second embodiment of the present invention. FIG. 7 is a plan view showing the placement of lifter pins used in the supporting mechanism shown in FIG. 6.

As shown in FIG. 6, the lifter pins 38A to 38C and 40A to 40C are divided into two groups, i.e., a first group of lifter pins 38A to 38C and a second group of lifter pins 40A to 40C. The lifter pins are respectively provided with actuators 80A to 80C and 82A to 82C correspondingly disposed therebelow.

As shown in FIG. 7, the actuators 80A to 80C and 82A to 82C are disposed along one circle, but FIG. 6 shows them on one plane, for the sake of comprehension. It may be arranged such that one group of actuators 80A to 80C are disposed on one circle, and the other group of actuators 82A to 82C are disposed along a different circle. The lifter pins 38A to 38C and 40A to 40C are respectively connected to the tips of the reciprocation rods 84A to 84C and 86A to 86C of the actuators 80A to 80C and 82A to 82C. The vertical movement of the actuators 80A to 80C and 82A to 82C are controlled by a vertical movement controller 68. Those portions of the intermediate chamber bottom plate 44, where the reciprocation rods 84A to 84C and 86A to 86C penetrate, are respectively provided with bellows 88.

The actuators 80A to 80C connected to one group of lifter pins 38A to 38C are operated to perform synchronous vertical movement. Similarly, the actuators 82A to 82C connected to the other group of lifter pins 40A to 40C are operated to perform synchronous vertical movement. The group of actuators 80A to 80C and the group of actuators 82A to 82C can be controlled independently of each other to perform vertical movement.

Also in the second embodiment, each group of lifter pins, i.e., the group of lifter pins 38A to 38C or lifter pins 40A to 40C, are controlled to synchronously move up and down. As a consequence, the second embodiment can provide the same operation and effect as those of the first embodiment described above. For example, one group of lifter pins 38A to 38C is exclusively used for transferring unprocessed wafers W, and the other group of lifter pins 40A to 40C is exclusively used for transferring processed wafers W.

Third Embodiment

The first embodiment includes a plurality of, e.g., two, base frames each provided with a plurality of, e.g., three, lifter pins 38A to 38C or 40A to 40C. Instead, there may be base frames 38 and 40 provided with no lifter pins 38A to 38C and 40A to 40C, but configured to function as holder plates, each of which comes into direct contact with the bottom of a wafer W to support it by the top face. In such an aspect, FIG. 8 is a plan view showing base frames (holder plates) used in a supporting mechanism according to a third embodiment of the present invention.

Figure 8:
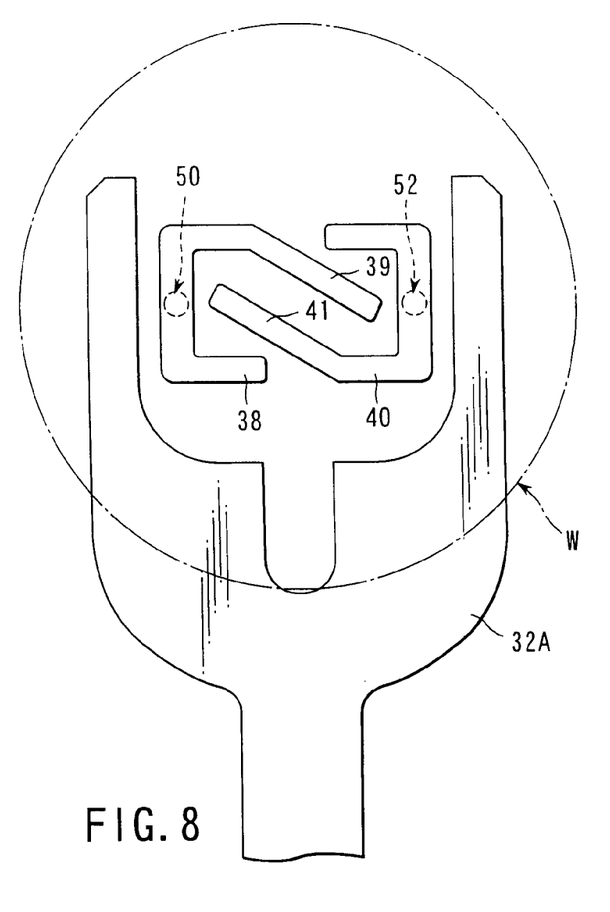
FIG. 8 is a plan view showing base frames used in a supporting mechanism according to a third embodiment of the present invention.

As shown in FIG. 8, the two base frames 38 and 40 are provided with no lifter pins thereon. Each of the base frames 38 and 40 come into direct contact with the bottom of a wafer W to support the wafer W. It should be noted that the two base frames 38 and 40 are arranged not to interfere with a pick, e.g., pick 32A, during transfer of a wafer. For this reason, the base frames 38 and 40 shown in FIG. 8 has a smaller size than the base frames 38 and 40 of the first embodiment shown in FIG. 3. The third embodiment can also provide the same operation and effect as those of the first embodiment described above.

Fourth Embodiment

Figure 9:
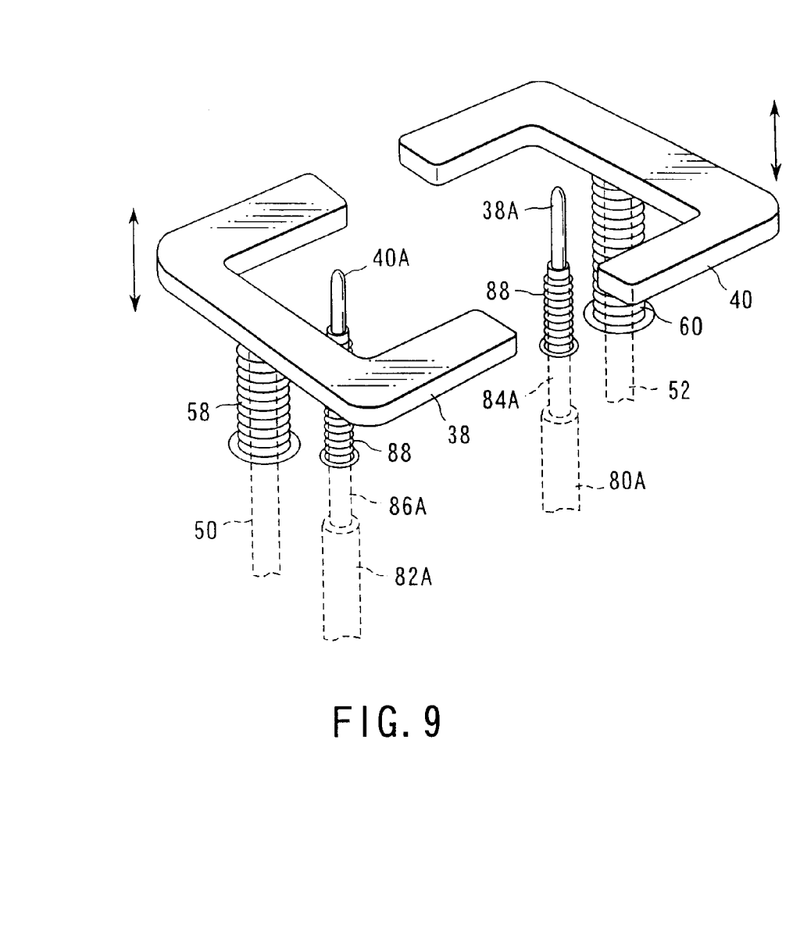
FIG. 9 is a perspective view showing a supporting mechanism according to a fourth embodiment of the present invention.
Figure 10:
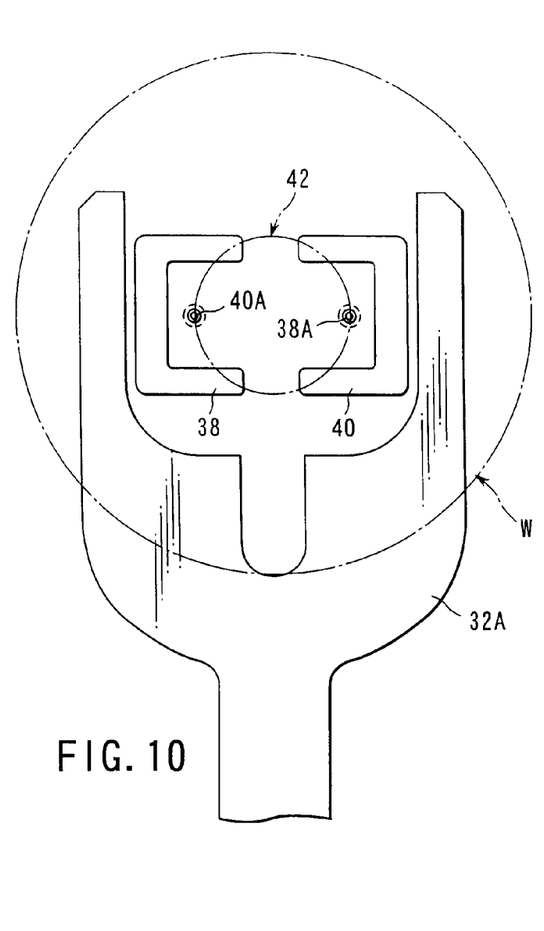
FIG. 10 is a plan view showing the supporting mechanism shown in FIG. 9.

The second embodiment includes no base frames, but includes lifter pins directly connected to reciprocation rods. The third embodiment includes no lifter pins, but includes base frames configured to directly support a wafer. These features of them can be combined for use. In such an aspect, FIG. 9 is a perspective view showing a supporting mechanism according to a fourth embodiment of the present invention. FIG. 10 is a plan view showing the supporting mechanism shown in FIG. 9.

As shown in FIGS. 9 and 10, this supporting mechanism includes lifter pins 38A and 40A provided with an associated structure the same as that shown in FIGS. 6 and 7. Specifically, the two lifter pins 38A and 40A are directly connected to the reciprocation rod 84A of an actuator 80A and the reciprocation rod 86A of an actuator 82A, respectively. However, the supporting mechanism includes no other lifter pins 38B, 38C, 40B, and 40C (see FIG. 3), but includes base frames 38 and 40 the same as those of the third embodiment shown in FIG. 8 to compensate for the function of the omitted lifter pins. Specifically, each of the base frames 38 and 40 is arranged to directly support the bottom of a wafer. In this case, however, the base frames 38 and 40 do not have a numeral "7" shape shown in FIG. 4, but have, e.g., a "U" shape, formed by excluding the portion that supports the lifter pin 38A or 40A.

In this case, the lifter pin 38A and base frame 38 form one group and are synchronously moved up and down. Also, the other lifter pins 40A and base frame 40 form one group and are synchronously moved up and down. The fourth embodiment can also provide the same operation and effect as those of the first embodiment described above.

Fifth Embodiment

Figure 11:
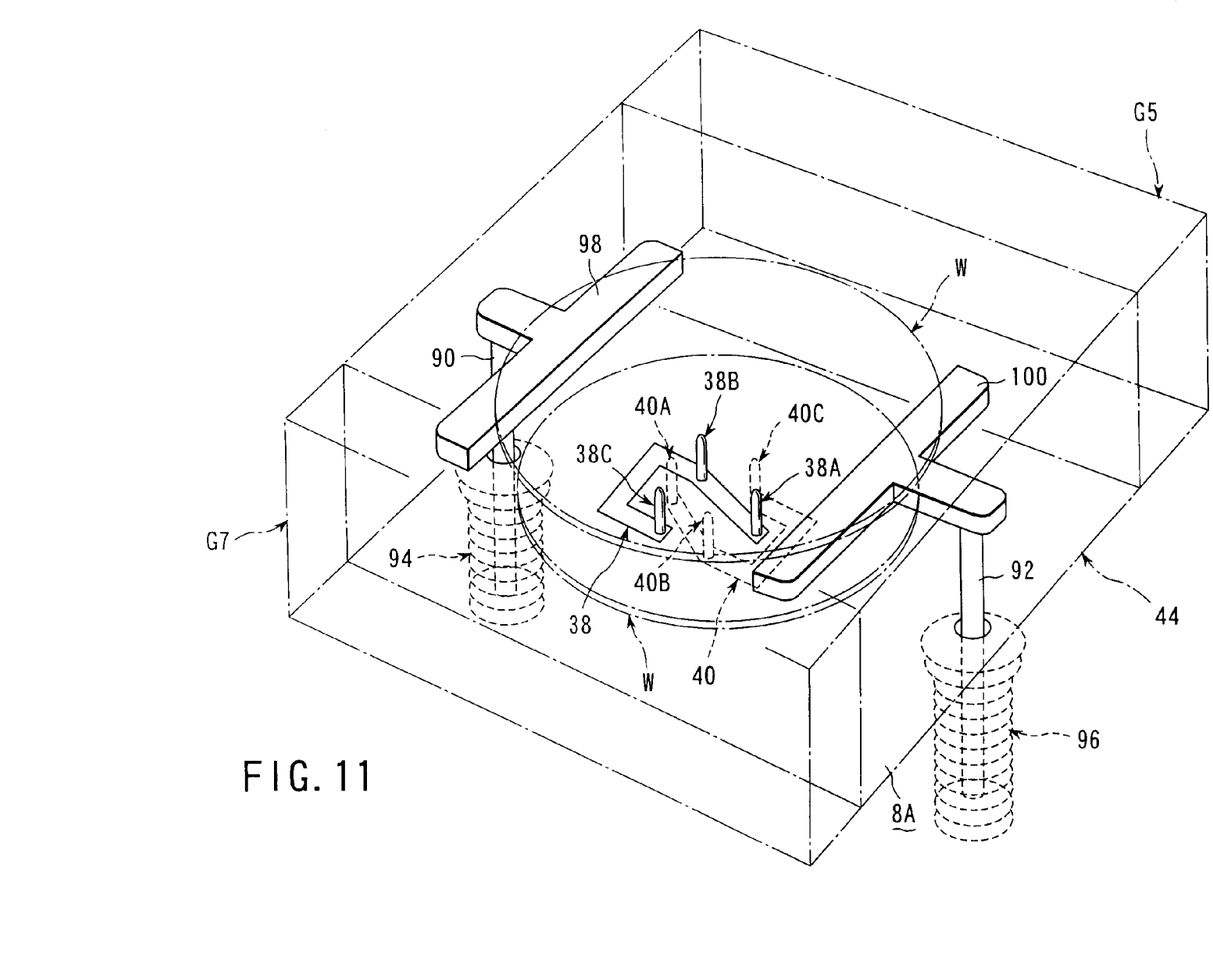
FIG. 11 is a perspective view showing a supporting mechanism according to a fifth embodiment of the present invention.
Figure 12:
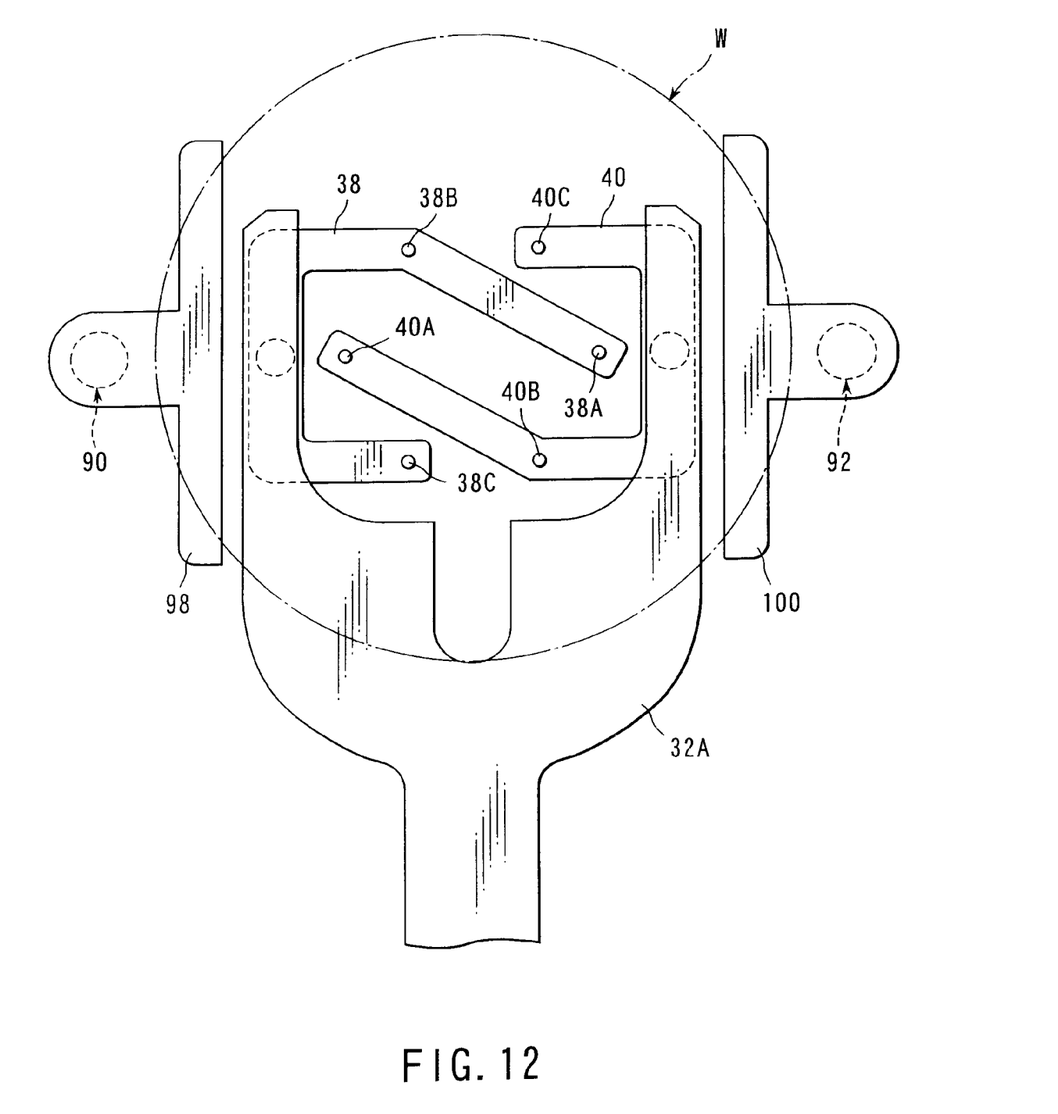
FIG. 12 is a plan view showing the supporting mechanism shown in FIG. 11.

Each of the first to fourth embodiments cannot handle two wafers at a time, but handles always only one wafer. However, means for secondarily supporting a wafer may be disposed to handle a plurality of, e.g., two, wafers at a time. In such an aspect, FIG. 11 is a perspective view showing a supporting mechanism according to a fifth embodiment of the present invention. FIG. 12 is a plan view showing the supporting mechanism shown in FIG. 11.

As shown in FIGS. 11 and 12, a supporting mechanism according to any one of the first to fourth embodiments is disposed at the center of an intermediate chamber 8A. A pair of reciprocation rods 90 and 92 are disposed outside the vertical movement area where a wafer W is moved up and down by the supporting mechanism. The reciprocation rods 90 and 92 are disposed at positions shifted by 90 degrees from gate valves G5 and G7 provided on opposite sides of the intermediate chamber 8A, so that they do not interfere with a pick 14A, 14B, 32A, or 34A to be inserted when a wafer is transferred into and out of the intermediate chamber 8A. FIGS. 11 and 12 shows a case where the supporting mechanism according to the first embodiment is disposed at the center of the intermediate chamber 8A. Those portions of the bottom plate 44 of the intermediate chamber, where the reciprocation rods 90 and 92 penetrate, are respectively provided with bellows 94 and 96, which maintain the interior of the intermediate chamber airtight, while allowing the reciprocation rods 90 and 92 to be moved up and down.

The reciprocation rods 90 and 92 are respectively moved up and down by actuators (not shown) disposed therebelow, which perform synchronous vertical movement. The reciprocation rods 90 and 92 are moved up and down by a stroke larger than that of the reciprocation rods 50 and 52. The reciprocation rods 90 and 92 may be connected to each other at the bottom, so that only one actuator suffices for them.

Support plates 98 and 100 made of, e.g., ceramic are respectively fixed to the tops of the reciprocation rods 90 and 92, and horizontally extend toward the center of the intermediate chamber 8A. The support plates 98 and 100 have a "T" shape in this embodiment, with top faces to hold a wafer W transferred by the first and second transfer means 14 and 22, while they are in direct contact with the bottom of the wafer W. The other intermediate chamber 8B is also provided with the same supporting mechanism as that disposed in the intermediate chamber 8A, as described above.

According to the fifth embodiment having the arrangement described above, the lifter pins 38A to 38C and 40A to 40C are operated, as in the first embodiment, while the pair of support plates 98 and 100 hold an unprocessed wafer W at a higher position, as shown in FIG. 11, for example. In other words, one wafer W is kept waiting at a higher position by the support plates 98 and 100, while another wafer is transferred therebelow into and from the intermediate chamber. As a consequence, the flexibility in handling target substrates improves.

Sixth Embodiment

Figure 13:
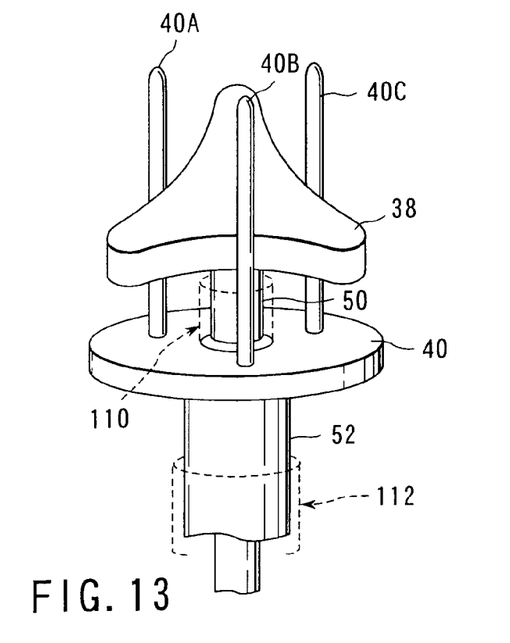
FIG. 13 is a perspective view showing a supporting mechanism according to a sixth embodiment of the present invention.
Figure 14:
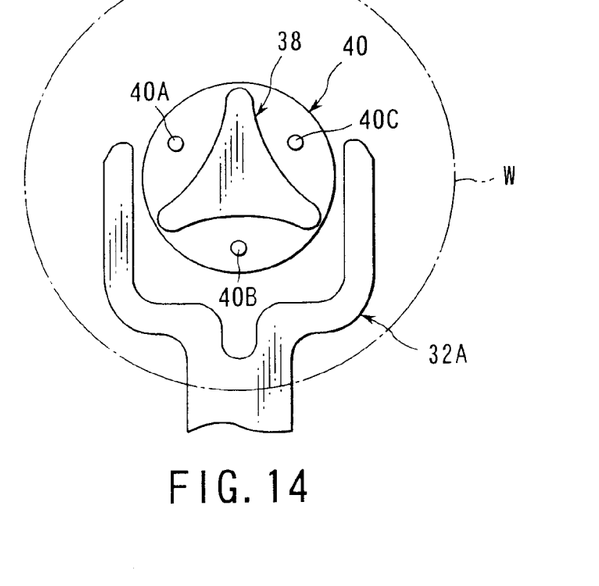
FIG. 14 is a plan view showing the supporting mechanism shown in FIG. 13.

The embodiments described above include a plurality of, e.g., two, base frames 38 and 40, which are disposed not to overlap with each other in the plan view. Instead, there may be base frames 38 and 40 disposed to overlap with each other in the plan view, i.e., to be stacked one above the other, thereby reducing the occupied space in the plan view. In such an aspect, FIG. 13 is a perspective view showing a supporting mechanism according to a sixth embodiment of the present invention. FIG. 14 is a plan view showing the supporting mechanism shown in FIG. 13.

As shown in FIGS. 13 and 14, a first base frame 38 is disposed above a second base frame 40, so that they vertically overlap with each other. The first base frame 38 is supported at the center by a first reciprocation rod, e.g., rod 50. The second base frame 40 is supported at the center by a second reciprocation rod, e.g., rod 52. The first and second reciprocation rods 50 and 52 form a coaxial structure, and can be moved up and down independently of each other. The two rods 50 and 52 may be disposed in parallel with each other, in place of the coaxial structure.

The first reciprocation rod 50 is connected to a first actuator, e.g., actuator 46 (see FIG. 2) at the bottom. The second reciprocation rod 52 is connected to a second actuator, e.g., actuator 48 (see FIG. 2) at the bottom. A longitudinally flexible first bellows 110 is interposed between the first base frame 38 and second base frame 40, and covers the first reciprocation rod 50. A longitudinally flexible second bellows 112 is interposed between the second base frame 40 and a transfer chamber bottom (not shown), and covers second reciprocation rod 52.

The second base frame 40 is formed of an almost circular plate, which is provided with a plurality of, e.g., three in this example, lifter pins 40A to 40C standing on the periphery. The top ends of the lifter pins 40A to 40C extend beyond the first base frame 38, to support a wafer W thereon. The lifter pins 40A to 40C are disposed on the periphery of the second base frame 40 at almost regular intervals in the angular direction.

On the other hand, the first base frame 38 has a deformed triangle shape, which is formed by curving the three sides of a regular triangle toward the center, so that it does not interfere with the three lifter pins 40A to 40C. The first base frame 38 is configured to come into direct contact with a wafer W to hold it by the top face. In the sixth embodiment, the top ends of the lifter pins 40A to 40C of the second base frame 40 are moved up beyond the first base frame 38, when they support a wafer W.

The sixth embodiment can provide an operation similar to that of the first embodiment described above. Specifically, the top face of the first base frame 38, and the lifter pins 40A to 40C of the second base frame 40 alternatively support a wafer W.

Since the two base frames 38 and 40 are stacked one above the other, the base frames 38 and 40 can be smaller and reduce the occupied area in the plan view. As a consequence, a pick with a smaller tip opening angle can be used for transferring a wafer without interfering with the base frames 38 and 40. Furthermore, during transfer of a wafer, the supporting mechanism can be easily controlled to perform vertical movement.

Figure 15:
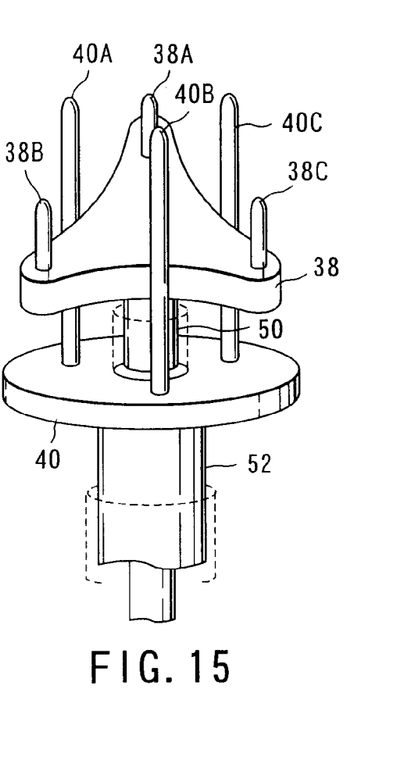
FIG. 15 is a view showing a supporting mechanism according to a modification of the sixth embodiment.

The sixth embodiment includes the first base frame 38 configured to support a wafer W by the top face. Instead, there may be a first base frame 38 provided with lifter pins. In such an aspect, FIG. 15 is a view showing a supporting mechanism according to a modification of the sixth embodiment. As shown in FIG. 15, the first base frame 38 is provided with a plurality of, e.g., three in this example, lifter pins 38A to 38C standing on the periphery. The lifter pins 38A to 38C are configured to support a wafer W by the top ends.

In the embodiments described above, a supporting mechanism is disposed in the intermediate chambers 8A and 8B, each formed of an airtight chamber that can be vacuum exhausted. Instead, a supporting mechanism may be disposed in a free space within the entrance transfer chamber 10 or common transfer chamber 6, so that it functions as a waiting position of a wafer.

In the embodiments described above, where the base frames 38 and 40 or support plates 98 and 100 are configured to support a wafer W by the top face, the top face comes into direct contact with the bottom of the wafer W. Instead, the top face may be provided with a plurality of projections having a height of about 1 mm and a diameter of about 5 mm, so that the projections come into contact with the bottom of a wafer to support it. Alternatively, the top face may be provided with a recess to hold a wafer W therein.

In the embodiments described above, the controller performs control such that one group of lifter pins or base frame supports unprocessed wafers W, while the other group of lifter pins or base frame supports processed wafers. Instead, discriminatory use of a plurality of lifter pins or base frames may be determined, depending on the type of a process (film-formation, etching, etc) to be performed on wafers W, the temperature of wafers W (timing before or after heating or cooling of wafers W), or other conditions of wafers W, (also taking into consideration a case where a supporting mechanism according to each of the embodiments is used in a common transfer chamber 6 or the like).

In the embodiments described above, the lifter pins or base frames are made of the same material. Instead, the lifter pins or base frames may be respectively made of different materials (for example, a heat-resistant material, heat-conductive material, and so forth), depending on some conditions of wafers W to be supported.

Furthermore, the controller may be arranged such that the respective numbers of wafers supported by the lifter pins or base frames become almost the same. This arrangement allows the time period between cleaning operations of wafer-contact portions to be increased, and also allows the service life of members, such as a bellows, of a supporting mechanism to be longer. Incidentally, a supporting mechanism according to the present invention may also be provided with a mechanism for rotating a wafer W.

In the embodiments described above, a semiconductor wafer is handled as a target substrate. The present invention may also be applied to a glass substrate or LCD substrate.

What is claimed is:

1. A semiconductor processing system, comprising:
   a process chamber configured to perform a semiconductor process on a target substrate;
   a first transfer chamber connected to the process chamber;
   an intermediate chamber connected to the first transfer chamber;
   a second transfer chamber connected to the intermediate chamber;
   a first transfer arm disposed inside the first transfer chamber;
   a second transfer arm disposed inside the second transfer chamber;
   a supporting mechanism provided at the intermediate chamber and configured to transfer a target substrate in cooperation with the first and second transfer arms,
   wherein the supporting mechanism comprises
   first and second holding portions disposed inside the intermediate chamber, each configured to be moved up and down and transfer a target substrate to and from the transfer arm, the first and second holding portions being configured to be moved relative to each other in a vertical direction without spatially interfering with each other, and the first and second holding portions providing target substrate positions for transferring a target substrate to and from the first and second transfer arms such that the target substrate positions overlap with each other in plan view; and
   first and second drives configured to move the first and second holding portions up and down,
   wherein each of the first and second holding portions includes a plurality of lifter pins having top ends, on which a substrate is placed, each of the first and second holding portions includes a base frame, and the plurality of lifter pins standing on the base frame, and the base frames of the first and second holding portions are disposed not to overlap with each other in plan view, and include extension portions extending toward each other and mutually beyond tips of the extension portions, and one of the lifter pins is supported near each of the tips of the extension portions.

2. The system according to claim 1, wherein the plurality of lifter pins are disposed along a circumference of an imaginary circle at substantially regular intervals.

3. The system according to claim 1, further comprising a pair of auxiliary holding portions for holding a substrate, disposed at positions sandwiching the first and second holding portions and configured to be moved up and down, wherein a position where the pair of auxiliary holding portions hold a substrate is above a position where the first and second holding portions hold a substrate.

4. The system according to claim 1, wherein the intermediate chamber is an airtight chamber configured to be vacuum-exhausted, the first and second drives are disposed outside the airtight chamber and connected to the first and second holding portions respectively through driving rods, and portions of the airtight chamber, where the driving rods penetrate, are respectively provided with longitudinally flexible bellows, which maintain an interior of the airtight chamber airtight.

5. The system according to claim 1, wherein the process chamber is configured to perform the semiconductor process within a vacuum atmosphere, the first transfer chamber is an airtight chamber configured to be vacuum-exhausted, and the second transfer chamber is an entrance transfer chamber.

6. The system according to claim 1, wherein the supporting mechanism further includes a controller configured to control the first and second drives, the controller being arranged to control the first and second drives to alternatively support a substrate by the first and second holding portions.

7. The system according to claim 6, wherein the controller is arranged to perform control such that the first holding portion engages only with target substrates transferred from the second transfer chamber to the first transfer chamber, and the second holding portion engages only with target substrates transferred from the first transfer chamber to the second transfer chamber.

8. A semiconductor processing system comprising:
a process chamber configured to perform a semiconductor process on a target substrate;
a first transfer chamber connected to the process chamber;
an intermediate chamber connected to the first transfer chamber;
a second transfer chamber connected to the intermediate chamber;
a first transfer arm disposed inside the first transfer chamber;
a second transfer arm disposed inside the second transfer chamber;
a supporting mechanism provided at the intermediate chamber and configured to transfer a target substrate in cooperation with the first and second transfer arms, wherein the supporting mechanism includes:
first and second holding portions disposed inside the intermediate chamber, each configured to be moved up and down and transfer a target substrate to and from the transfer arm, the first and second holding portions being configured to be moved relative to each other in a vertical direction without spatially interfering with each other, and the first and second holding portions providing target substrate positions for transferring a target substrate to and from the first and second transfer arms such that the target substrate positions overlap with each other in plan view,
first and second drives configured to move the first and second holding portions up and down, and
a controller configured to control the first and second drives, the controller being arranged to control the first and second drives to alternatively support a substrate by the first and second holding portions,
wherein the first and second holding portions respectively include first and second base frames, and the first and second base frames are disposed not to overlap with each other in plan view, and include respective first and second extension portions extending toward each other and mutually beyond tips of the respective other extension portion.

9. The system according to claim 8, wherein each of the first and second base frames is equipped with a plurality of lifter pins standing thereon and having top ends, on which a substrate is placed.

10. The system according to claim 8, wherein each of the first and second base frames includes a holder plate having a top face, on which a substrate is placed.

11. The system according to claim 8, wherein one of the first and second base frames is equipped with a plurality of lifter pins standing thereon and having top ends, on which a substrate is placed, and the other of the first and second base frames includes a holder plate having a top face, on which a substrate is placed.

12. The system according to claim 9, wherein one of the lifter pins is supported near each of the tips of the extension portions of the first and second base frames.

13. The system according to claim 9, wherein the plurality of lifter pins are disposed along a circumference of an imaginary circle at substantially regular intervals.

14. The system according to claim 8, further comprising a pair of auxiliary holding portions for holding a substrate, disposed at positions sandwiching the first and second holding portions and configured to be moved up and down, wherein a position where the pair of auxiliary holding portions hold a substrate is above a position where the first and second holding portions hold a substrate.

15. The system according to claim 8, wherein the intermediate chamber is an airtight chamber configured to be vacuum-exhausted, the first and second drives are disposed outside the airtight chamber and connected to the first and second holding portions respectively through driving rods, and portions of the airtight chamber, where the driving rods penetrate, are respectively provided with longitudinally flexible bellows, which maintain an interior of the airtight chamber airtight.

16. The system according to claim 15, wherein the process chamber is configured to perform the semiconductor process within a vacuum atmosphere, the first transfer chamber is an airtight chamber configured to be vacuum-exhausted, and the second transfer chamber is an entrance transfer chamber.

17. The system according to claim 8, wherein the controller is arranged to perform control such that the first holding portion engages only with target substrates transferred from the second transfer chamber to the first transfer chamber, and the second holding portion engages only with target substrates transferred from the first transfer chamber to the second transfer chamber.

* * * * *